United States Patent
Vahedi et al.

(10) Patent No.: US 7,018,780 B2
(45) Date of Patent: Mar. 28, 2006

(54) METHODS FOR CONTROLLING AND REDUCING PROFILE VARIATION IN PHOTORESIST TRIMMING

(75) Inventors: Vahid Vahedi, Albany, CA (US); Linda B. Braly, Santa Fe, NM (US)

(73) Assignee: Lam Research Corporation, Fremont, CA (US)

( * ) Notice: Subject to any disclaimer, the term of this patent is extended or adjusted under 35 U.S.C. 154(b) by 98 days.

(21) Appl. No.: 10/378,122

(22) Filed: Feb. 28, 2003

(65) Prior Publication Data

US 2003/0148224 A1    Aug. 7, 2003

Related U.S. Application Data

(63) Continuation-in-part of application No. 09/948,392, filed on Sep. 6, 2001, now Pat. No. 6,653,058, which is a continuation of application No. 09/340,070, filed on Jun. 25, 1999, now Pat. No. 6,316,169.

(51) Int. Cl.
*G03F 7/00* (2006.01)
*G03F 7/36* (2006.01)

(52) U.S. Cl. .................... 430/314; 430/313; 430/317; 216/37; 216/67; 438/694; 438/695

(58) Field of Classification Search ............... 430/313, 430/314, 317; 216/37, 67; 438/694, 695
See application file for complete search history.

(56) References Cited

U.S. PATENT DOCUMENTS

| 6,316,169 | B1 * | 11/2001 | Vahedi et al. | 430/329 |
| 6,372,634 | B1 * | 4/2002 | Qiao et al. | 438/637 |
| 6,653,058 | B1 * | 11/2003 | Vahedi et al. | 430/329 |
| 6,670,265 | B1 * | 12/2003 | Wang et al. | 438/624 |

* cited by examiner

*Primary Examiner*—Nicole Barreca
(74) *Attorney, Agent, or Firm*—Martine Penilla & Gencarella LLP

(57) ABSTRACT

A method for controlling a removal of photoresist material from a semiconductor substrate is provided. The method includes providing the semiconductor substrate having a photoresist mask formed thereon. The method also includes forming a conformal layer of polymer over the photoresist mask and a portion of the semiconductor substrate not covered by the photoresist mask while concurrently removing a portion of the conformal layer of polymer. The thickness of the conformal layer of polymer on each region of the semiconductor substrate is set to vary depending on a removal rate of the conformal layer of polymer in each region of the semiconductor substrate.

22 Claims, 11 Drawing Sheets

METHODS FOR CONTROLLING AND REDUCING PROFILE VARIATION IN PHOTORESIST TRIMMING

CROSS-REFERENCE TO RELATED APPLICATIONS

This application is a continuation-in-part of application Ser. No. 09/948,392, filed Sep. 6, 2001, now U.S. Pat. No. 6,653,058 which is a continuation of application Ser. No. 09/340,070, filed Jun. 25, 1999, now U.S. Pat. No. 6,316,169 from which priority under 35 U.S.C. § 120 is claimed. The disclosure of this application is incorporated herein by reference.

BACKGROUND OF THE INVENTION

1. Field of the Invention

The present invention relates to the process of trimming photoresist material on semiconductor wafers and, more particularly, to improving photoresist trimming while minimizing critical dimension variation between photoresist lines and maximizing photoresist budget.

2. Description of the Related Art

During semiconductor wafer processing, features of the semiconductor device are defined in a semiconductor wafer using well-known patterning and etching processes. FIG. 1 is a partial cross-sectional view illustrating several conventional layers of a semiconductor wafer 10. As shown, the semiconductor wafer 10 includes a semiconductor substrate 12 formed of, e.g., silicon, that supports intermediate layers 15. Intermediate layers 15, for example, include a first layer 14 formed of either a conductive material (e.g., polysilicon) or a dielectric material (e.g., $SiO_2$, depending on the type of device that is being fabricated). The intermediate layers 15 also may include a second layer 16, such as a hard mask layer or an anti-reflective coating (ARC) layer. For ease of illustration, intermediate layers 15 is shown comprising only two layers, but as is well known in the art, more layers may be provided.

Conventionally, to pattern the intermediate layers 15, a layer of photoresist material 18 is deposited onto the semiconductor wafer 10 over the intermediate layers 15, and then patterned by a suitable process such as photolithography. In general, the semiconductor wafer 10 is exposed to light filtered by a reticle, which is a glass plate patterned with the desired integrated circuit layer features.

After passing through the reticle, the light impinges upon the surface of the photoresist material 18. The light changes the chemical composition of the photoresist material 18 such that a developer can be used to remove either the exposed regions (in the case of positive photoresist materials) or the unexposed regions (in the case of negative photoresist materials) of the photoresist material. In the case of positive photoresist materials, the light changes the structure and chemical properties of the photoresist material creating a number of polymerized photoresist sections. These polymerized photoresist sections are then removed using a solvent in a development process leaving a number of photoresist lines. Thereafter, the wafer is etched to remove the material from the areas that are no longer protected by the photoresist material and thereby define the desired features in the semiconductor wafer 10.

FIG. 2A depicts a more detailed view of the photoresist layer 18 subsequent to being patterned into a photoresist mask. In the process described above, the polymerized photoresist are removed, leaving photoresist lines 18a–d, which protect underlying layers from etching.

One important characteristic of the photoresist lines is known as an aspect ratio, which compares the vertical space between lines with the horizontal space. For example, the space between photoresist lines 18a and 18b would have an aspect ratio of approximately 1:2, while the space between photoresist lines 18b and 18c would have an 15 aspect ratio of about 5:2.

Each photoresist line 18a–d has a line width or critical dimension CD1, which determines the width of lines that will be etched in intermediate layers 15. Each photoresist line 18a–d also has a height, which is also known as a resist budget RB1. During the process of etching intermediate layers 15, photoresist lines 18a–d are also etched. Therefore, resist budget RB1 represents the amount of photoresist that may be consumed during the etching process. For ease of illustration, in FIGS. 2B–2D, only four photoresist lines 18a–d are shown, however, as is well known in the art, numerous photoresist lines 18a–d may be formed to produce the desired feature geometries. The feature geometries will in turn enable production of the electrical interconnections intended by the manufacturer, and enable the production of a functioning integrated circuit.

One technique that engineers use to increase the operating speeds of semiconductor devices is reducing the sizes of conductive lines within the semiconductor devices. Although much improvement has occurred in photolithography systems to enable the fabrication of small feature sizes, current lithographic tools are still unable to define feature sizes much below about 0.18 microns. Unfortunately, the costs of developing a photolithography system to define feature sizes below 0.18 microns would involve manufacturing of a new tool, and therefore would be prohibitively expensive. Thus, plasma etching has been considered as a method for further reducing the critical dimension CD1, which defines feature sizes of photoresist lines 18a–d. This technique is called photoresist trimming.

Typically, several shortcomings can be associated with the prior art photoresist trimming process. First, undesired tapering effect in photoresist lines are caused by photoresist trimming of photoresist lines in dense areas of photoresist lines. Second, photoresist trimming causes undesired resist budget reduction. Next, photoresist trimming results in a variation in critical dimensions of photoresist lines defined in different regions of the substrate wafer. The following is a brief description of the first limitation. The descriptions of the second and third drawbacks will follow immediately thereafter.

FIGS. 2B–2C illustrate the undesired tapering effect in photoresist lines resulting from prior art photoresist trimming in a densely packed areas of photoresist lines. FIG. 2B illustrates photoresist trimming of the patterned photoresist layer 18. As shown, after photolithography has been performed to produce photoresist lines 18a–d of, for example, about 0.18 microns, a plasma etch is performed to further reduce the critical dimensions of the photoresist lines 18a–d. Photoresist lines 18a–d are bombarded with an etchant flow 20/20', such as oxygen ions, using a low RF bias power to create a plasma. As shown, etchant flow 20' is distinguished from etchant flow 20 to illustrate ions traveling toward the photoresist lines 18a–d at somewhat variable angles.

As shown in FIG. 2B, the degree of exposure of each photoresist line 18e–g to the ion bombardment varies depending on the proximity of the photoresist line to that of other photoresist lines. If a photoresist line is located in an open area, the sidewalls of the photoresist line are in general, fully exposed to angled etchant flow 20'. However, if a photoresist line is located in a dense area, the amount of etchant flow 20' that reaches the lower portions of photoresist sidewalls may be greatly reduced due to a large amount of etchant flow 20' being blocked by the neighboring photoresist line.

For example, photoresist line 18a is isolated from other photoresist lines 18b–d. Therefore, photoresist lines 18b–d do not affect the exposure of photoresist line 18a to etchant flow 20'. However, because photoresist line 18c is located in close proximity to photoresist lines 18b and 18d, photoresist lines 18b and 18d block much of etchant flow 20'. For an etchant ion to reach the bottom of a sidewall of photoresist line 18c, it must either travel towards the sidewall at the perfect angle, or bounce from sidewall to sidewall as shown in FIG. 2B. The amount of etchant flow 20' that reaches the sidewalls of photoresist lines 18b and 18d are likewise reduced by the close proximity of photoresist line 18d.

FIG. 2C illustrates a prior art process of photoresist trimming that has been completed. As photoresist lines 18b–d are located in a dense area of photoresist lines, the top portions of photoresist lines 18b–d have been consumed much more rapidly by etchant flow 20/20' than the bottom portions. Therefore, the sidewalls of photoresist lines 18b–d show an undesirable tapering effect, as opposed to critical dimension CD2, which is more uniform for photoresist line 18a. An ideal etch operation would leave vertical sidewalls in the surface of semiconductor wafer 10.

As the top of densely packed photoresist lines 18b–d has a higher horizontal etch or trim rate than the bottom, critical dimension CD of photoresist lines 18b–d at the top is less than critical dimension CD4 of photoresist lines 18b–d at the bottom. This variation in critical dimensions CD3 and CD4 may result in errors during etching of the intermediate layers 15 below photoresist layer 18. Such errors may in turn cause inconsistencies in the conductive lines formed during fabrication, therefore adversely effecting the speed and response time of the semiconductor device.

Another problem associated with the technique of photoresist trimming is that etchant flow 20/20' significantly reduces resist budget RB1 of photoresist lines 18a–d as shown in FIG. 2A, to resist budget RB2, as shown in FIG. 2C. During etching the intermediate layers 15, photoresist lines 18a–d protect the portions of intermediate layers 15 defined below the photoresist lines 18a–18d, however during the process, the photoresist material itself will be etched away. Therefore, it is important to have an adequate resist depth or budget to ensure that there is enough photoresist material to prevent damage to the layers below. Because photoresist trimming reduces the resist budget of photoresist lines 18a–d, the process increases the chances that the layers below the photoresist material will be damaged due to insufficient resist budget.

Yet another problem associated with the prior art photoresist trimming process is forming photoresist lines having varied critical dimensions as a result of being defined in different regions of the substrate wafer. As illustrated in FIGS. 2D–2G, the prior art photoresist trimming process results in wafer substrates having non-uniform profiles. FIG. 2D, for example, shows a simplified cross sectional view of the semiconductor wafer 10. The semiconductor wafer 10 includes the substrate 12 configured to support the intermediate layers 15, which in one embodiment, includes the first layer 14 and the second layer 16. As illustrated, the semiconductor wafer 10 further includes the photoresist layer 18 used during the pattering and etching processes so as to form the features of the semiconductor devices. Different regions of the semiconductor wafer 10, such as a central region 10c and edge regions 11e2 and 10e1 have been marked accordingly and shown in FIG. 2D.

As described in more detail above, after depositing the layer of photoresist mask 18 over the intermediate layers 15, the photoresist layer 18 is patterned into the mask. Thereafter, the polymerized sections, formed as a result of exposing unmarked portions of the photoresist layer 18 to light, are removed leaving the photoresist lines 18e–18g, as shown in FIG. 2E. Each of the photoresist lines 18e–g is shown to respectively have critical dimensions CD5, CD6, and CD7 and the resist budget RB1. The critical dimension CD5, CD6, and CD7 and resist budge RB1 of the each of the corresponding photoresist lines 18e–g are expected to be the same irrespective of the location of the photoresist lines 18e–g. Simply stated, it is expected that the photoresist line 18e and 18g defined in the edge regions 10c2 and 10c1 and the photoresist line 18f defined in the center region 10c of the semiconductor wafer 10 to have the same critical dimension and resist budget. It must be noted that for ease of illustration and reference, only one photoresist line is shown in each of the edge region 10e2 and 10e1 and the center region 10c (18e and 18g and 18f, respectively). However, as is well known in the art, numerous photoresist lines 18e–18g can be formed in each of the edge and center regions of the semiconductor wafer so as to produce the desired feature geometries.

FIG. 2F depicts the prior art Photoresist trimming of the photoresist lines 18e–g using the plasma etching. The photoresist lines 18e–g are bombarded with the etchant flow 20 so as to equally reduce the critical dimension of each photoresist line 18e–g. However, at the conclusion of the prior art photoresist trimming process, the critical dimensions and photoresist budgets of the photoresist lines 108e–g is shown to vary throughout the semiconductor wafer 10, as shown in FIG. 2G. The photoresist lines 18e and 18g, respectively defined in the edge regions 10e2 and 10e1 are shown to respectively have critical dimensions CD5' and CD7', each of which is less than the corresponding initial critical dimension CD5 and CD7. In a like manner, photoresist lines 18e and 18g are shown to have a reduced resist budge RB2e. Similarly, the photoresist line 18f, defined in the center region 10c of the semiconductor wafer 10 is also shown to have a reduced critical dimension CD6' and resist budget RB2c. However, comparatively, the critical dimension CD6' of the photoresist line 18f is shown to be substantially less than the critical dimensions CD5' and CD7' of respective photoresist lines 18e and 18g. Similarly, the resist budget RB2c of the photoresist line 18f is substantially less than the resist budget RB2e of the photoresist lines 18e and 18g.

Producing of photoresist lines with varied and inconsistent critical dimensions can be understood with reference to the prior art etching operation performed in the etch chamber 52, as shown in FIG. 2H. The semiconductor wafer 10 is placed on a bottom chuck 54 defined in the etch chamber 52. The illustrated bottom chuck 54 and a top chuck 56 are respectively connected to a bottom RF power 66 and top RF power 64. Residue resulting from the etching operation is configured to be purged using a plurality of exhaust pipes 62.

As shown, an etchant gas 68 defined in an etchant container 58 is introduced into the etch chamber 52 using a nozzle 60 defined in the very center of the top chuck 56. As shown, a concentration of a center etchant flow 20c is greater than the concentration of an edge etchant flow 20e. Thus, as illustrated, depending on being defined in the center region 10c as opposed to the edge regions 10e1 and 10e2 of the semiconductor wafer 10a, the photoresist lines are exposed to a different degree of etchant. That is, the photoresist lines 18e and 18g are exposed to the edge etchant flow 20e which concentration of etchant flow is substantially lower than the concentration of the center etchant flow 20f applied to the photoresist line 18f defined in the center 10c. As a result, a top portion of the photoresist line 18f is exposed to a greater concentration of the etchant flow 20c, causing the photoresist line 18f to be consumed more rapidly. Thus, generally, the critical dimension and resist budget of the photoresist lines defined in the center region are substantially less than the critical dimension and resist budget of the photoresist lines defined in the edge regions of the semiconductor substrate. The variation in the critical dimensions CD5' through CD7' is disfavored as it can result in errors during etching of the intermediate layers 15 defined below the photoresist layer 18. As described above, these errors adversely effect the speed and response time of the semiconductor devices. As to the reduced resist budget, the prior art increases chances of damaging the intermediate layers 15 due to having insufficient resist budget.

Despite the development of photoresist trimming and the growing need for semiconductor devices with very small and conductive lines, a reliable method for preventing the tapering of photoresist lines in dense areas, preserving photoresist budget, and preventing formation of non-uniform critical dimension is not available. In view of the foregoing, there is a need for a reliable method for trimming photoresist material from photoresist lines in semiconductor wafers while maintaining critical dimensions of the photoresist lines consistent throughout the semiconductor wafer and maximizing the resist budget of each line.

SUMMARY OF THE INVENTION

Broadly speaking, the present invention fills this need by providing a method for controlling and tuning a removal of photoresist material from photoresist lines in semiconductor wafers during a photoresist trimming process. In one embodiment, the photoresist trimming process of the present invention is believed to maintain photoresist lines critical dimensions and resist budgets consistent and uniform throughout the semiconductor wafer. Several inventive embodiments of the present invention are described below. The present invention can be implemented in numerous ways, including as a process, an apparatus, a system, a device, or a method. Several embodiments of the present invention are described below.

In one embodiment, a method for controlling a removal of photoresist material from a semiconductor substrate is provided. The method includes providing the semiconductor substrate having a photoresist mask formed thereon. The method also includes forming a conformal layer of polymer over the photoresist mask and a portion of the semiconductor substrate not covered by the photoresist mask while concurrently removing a portion of the conformal layer of polymer. The thickness of the conformal layer of polymer on each region of the semiconductor substrate is set to vary depending on a removal rate of the conformal layer of polymer in each region of the semiconductor substrate.

In another embodiment, a method for reducing a removal of photoresist material from a semiconductor wafer is provided. The method includes providing a semiconductor substrate having an intermediate layer. The method further includes forming a layer of photoresist mask over the intermediate layer using the photoresist material. Also included is forming a conformal layer of polymer over the photoresist mask while concurrently etching the conformal layer of polymer using a plasma. The conformal layer of polymer is set to be formed so as to have a greater thickness in a center region of the semiconductor wafer than edge regions of the semiconductor wafer. The thicker portion of the conformal layer of polymer formed in the center region is removed instead of the photoresist material.

In still a further embodiment, a method for tuning photoresist material removal from a semiconductor wafer is provided. The method includes providing a semiconductor substrate having an intermediate layer and forming a layer of photoresist mask over the intermediate layer. The method also includes forming a conformal layer of polymer over the photoresist mask. The thickness of the conformal layer of polymer is set to vary depending on a region of the semiconductor wafer. The method also includes etching the conformal layer of polymer. The etching is configured to continue until the conformal layer of polymer is removed completely.

The advantages of the present invention are numerous. The present invention advantageously controls center-to-edge profile variation of photoresist lines critical dimensions during photoresist trimming. This is beneficial as semiconductor devices with interconnections of less than about 0.18 microns wide can be fabricated without damaging such interconnections during the fabrication process. This is important because, as speeds at which the semiconductor devices operate increase, and feature sizes within the semiconductor device decrease, fabrication becomes an even more delicate process. The present invention enables tuning of critical dimensions and resist budgets of photoresist lines, reducing errors during fabrication, which could lead to a reduction in speed, or even failure of the device.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

Methods for controlling and tuning a removal of photoresist material from from photoresist lines in semiconductor wafers are provided. In one embodiment, center-to-edge profile variation in photoresist lines formed during the photoresist trimming is reduced and controlled using a polymer inducing gas, thus maintaining overall consistent and uniform critical dimensions resist budgets for each photoresist lines.

In one preferred embodiment, a small amount of a polymer inducing gas additive is introduced into an etch chamber during the etching operation so as to concurrently deposit a deposition precursor on the surfaces of the photoresist lines. In one embodiment, a thicker deposition precursor layer is formed on the photoresist lines defined in a center of the semiconductor wafer, thus compensating for the exposure of the photoresist to a greater concentration of etchant/deposition flow. Several inventive embodiments of the present invention are described below. The methods of the invention will be described with certain process operations used to define features of a semiconductor device. In particular, patterning and etching operations used to define features of a semiconductor device including the technique of photoresist trimming will be discussed. Those skilled in the art will appreciate that the methods of the invention are not limited to the exemplary structures shown, but instead may be used to facilitate removal of photoresist material in any semiconductor device.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
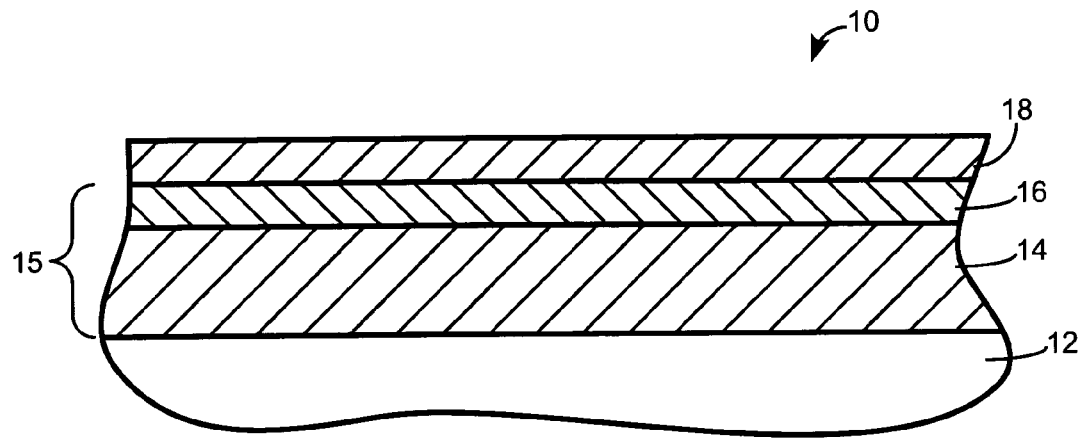
FIG. 1 is a partial cross-sectional view illustrating several conventional layers of a semiconductor wafer, in accordance with the prior art.
Figure 2A:
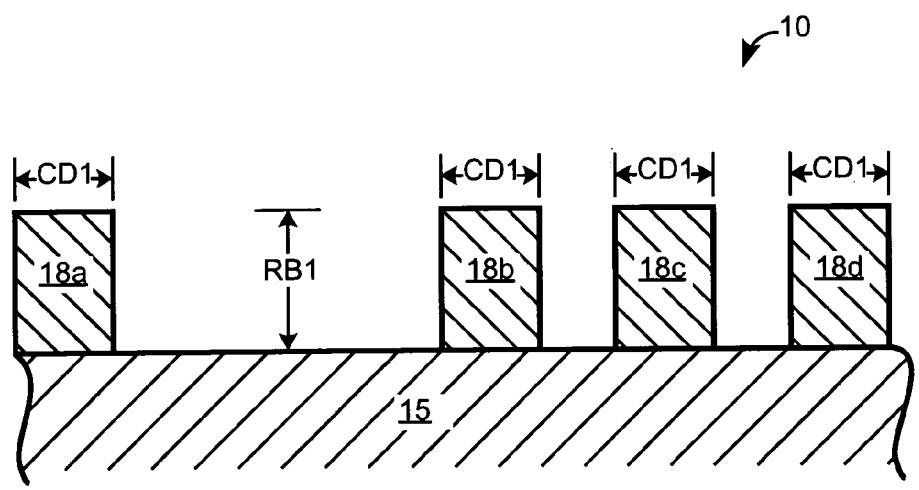
FIG. 2A is a detailed view of the patterned photoresist layer, in accordance with the prior art.
Figure 2B:
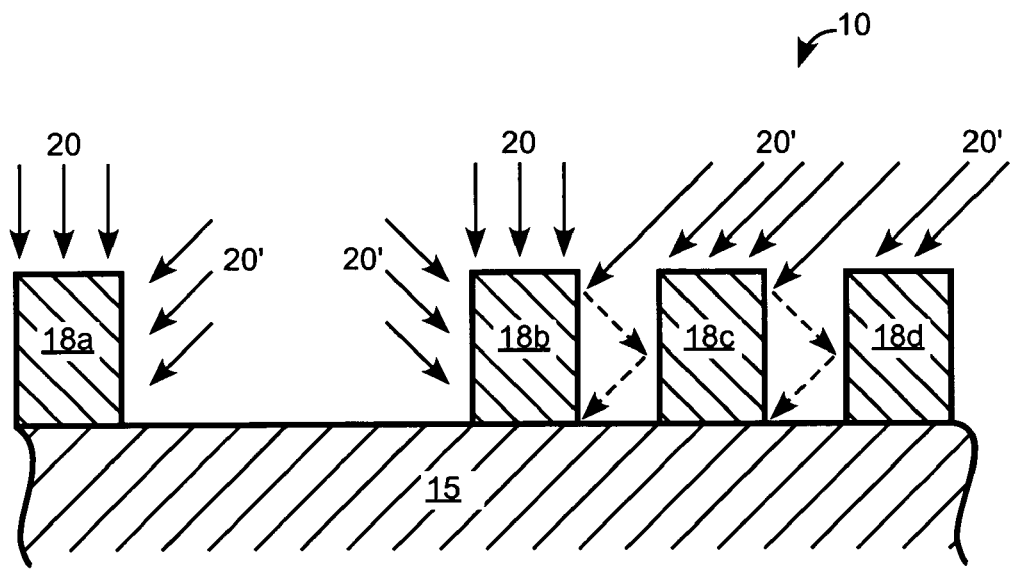
FIG. 2B illustrates patterned photoresist layer during the prior art process of photoresist trimming.
Figure 3A:
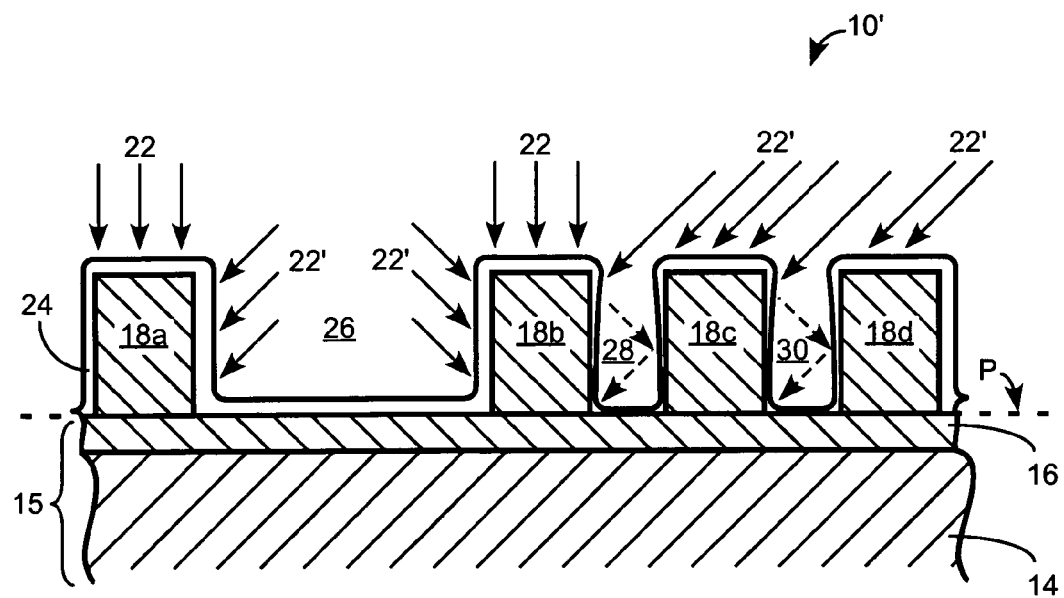
FIG. 3A illustrates a patterned photoresist layer similar to FIG. 2A with the addition of a conformal polymer film, in accordance with another embodiment of the present invention.

FIG. 3A illustrates a patterned photoresist layer 18 as shown in FIG. 2A with the addition of a conformal polymer film 24, in accordance with one embodiment of the present invention. Photoresist layer 18 has been deposited onto semiconductor wafer 10' over intermediate layers 15, which includes first layer 14 and second layer 16 in accordance with conventional technologies. First layer 14 formed of either a conductive material (e.g., polysilicon) or a dielectric material (e.g. SiO2) depending on the type of device that is being fabricated. Examples of conductive material include polysilicon, doped polysilicon, and aluminum.

Examples of dielectric material include $SiO_2$, $Si_3N_4$, SiON, as well as low dielectric constant materials. As used in connection with the description of the invention, the term "low K material" means any material having a dielectric constant (K) lower than that of $SiO_2$, which has a dielectric constant of about 4.0. Representative low K materials include benzocyclobutene (BCB), FLARE, SiLK, parylene, and polytetrafluoroethylene (PTFE) such as GORE-TEX. SiLK is an organic material produced by Dow Corning Corporation of Midland, Mich. FLARE is an organic spin-on polymer formulated for use as a stand alone, low K interlayer dielectric produced by Allied Signal of Morristown, N.J.

Second layer 16 may include a hard mask layer or an anti-reflective coating (ARC) layer, or both. A hard mask layer, which is typically made from silicon oxynitride (SiON), silicon nitrides ($Si_xN_y$), silicon dioxide ($SiO_2$) or tetraethcoxysilane (TEOS), generally has a thickness in the range from about 1 angstrom to about 5,000 angstroms to provide protection for first layer 14. Those skilled in the art are familiar with suitable techniques for forming hard mask layer.

An ARC layer, which may be made from known organic materials, planarizes the surface of the wafer 10' and aids in the patterning of small images by reducing the amount of light that is scattered. The ARC layer may be formed in accordance with known techniques, e.g., spinning and baking. For ease of illustration, intermediate layers 15 are shown comprising only two layers, but as is well known in the art, more layers may be used to form intermediate layers 15.

Photoresist layer 18 may be made from known photoresist materials, which are typically organic. As is well known to those skilled in the art, the layer of photoresist material 18 is used in the patterning and etching operations to define the desired features of the semiconductor device. Photoresist lines 18a–d are preferably patterned to the smallest critical dimension possible using photolithography, which is about 0.18 microns. However, because an even smaller critical dimension is desired, photoresist lines 18a–d then undergo the process of the present invention.

As shown in FIG. 3A, a deposition flow 22/22' deposit deposition polymers on top of photoresist lines 18a–d and intermediate layers 15, forming a conformal polymer film 24. Deposition flow 22/22' may be created by introducing a suitable process gas to a plasma environment. The gas is decomposed by the plasma and produces polymers, which are similar to photoresist in composition and which provide protection for photoresist lines 18a–d from the plasma etching performed during the process of photoresist trimming.

Hydroflourocarbon plasmas (e.g., CHxFy such as $CH_2F_2$ or CHF), flourocarbons (e.g., CFx such as $CF_4$), and hydrocarbon plasmas, (e.g. CHx including hydrocarbons such as $CH_4$ or $C_2H_6$) are known to produce polymers with low ion bombardment that result in the deposition of a polymer film 24. For example, a fluorocarbon such as $CF_4$ splits into $CF_3$ and F when encountering an electron from an excited plasma environment. Then the $CF_3$ is deposited on top of semiconductor wafer 10' to start forming and building up polymer film 24.

Deposition flow 22' is distinguished from deposition flow 22 by its angle of incidence with respect to semiconductor wafer 10'. That is, deposition flow 22 is substantially normal with respect to the plane of semiconductor wafer 10', while deposition flow 22' is angled with respect to the plane P of semiconductor wafer 10'. FIG. 3A illustrates the polymer deposition process to show how the locations of each photoresist line 18a–d effects deposition precursor flow 22' and results in essentially uniform polymer film thickness on sidewalls in a low aspect ratio area 26 and non-conformity on sidewalls in high aspect ratio areas 28 and 30 (i.e. in closely spaced lines). However, polymer film 24 may be formed at the same time that a plasma etch is used to trim the photoresist lines 18a–d. Because polymer film 24 has a similar composition to that of photoresist material, it may also be ashed by the same process recipe that ashes photoresist.

The exposure of the surfaces of photoresist lines 18a–d and intermediate layers 15 to deposition flows 22/22' varies depending on the aspect ratio of the space between two photoresist lines. For example, because photoresist line 18a is isolated from other photoresist lines 18, all sides of photoresist line 18a are fully exposed to deposition precursor flow 22'. The same is true for the left sidewall of photoresist line 18b, which is isolated away from photoresist line 18a. Therefore, polymer film 24 forms in an even manner on the right sidewall of photoresist line 18a and the left sidewall of photoresist line 18b. Consequently, low aspect ratio space 26 represents an open area that is fully exposed to deposition precursor flow 22'.

In contrast, high aspect ratio areas 28 and 30 do not have full exposure to deposition precursor flow 22', which results in a tapering effect along the sidewalls of photoresist lines 18b–d that border high aspect ratio areas 28 and 30. Because photoresist line 18c is located in close proximity to photoresist lines 18b and 18d, much of deposition precursor flow 22' is blocked from reaching the lower parts of the sidewalls of high aspect ratio areas 28 and 30 by the neighboring photoresist lines. For deposition precursors to form at the bottom of the sidewalls of high aspect ratio areas 28 and 30, the precursors must either travel towards the sidewall at the perfect angle, or bounce from sidewall to sidewall as shown in FIG. 3A. Therefore, polymer film 24 is much thinner at the bottom of high aspect ratio areas 28 and 30 than it is at other locations.

The aforementioned fluorocarbon and hydrogen gases that aid in forming polymer 30 film 24 may be distinguished by their level of "stickiness". A "sticky" deposition precursor increases the thickness of the polymer film on top of photoresist lines and low aspect ratio areas, and decreases thickness in high aspect ratio areas. A less sticky deposition precursor will do the opposite. Typically, when a polymer inducing gas has a higher hydrogen concentration than another, it is stickier. The ability to choose a stickier or a less sticky deposition precursor grants an additional level of control over the etch rate ratios between the top surfaces of the photoresist lines, and regions of the semiconductor wafer in both low and high aspect ratio areas.

Figure 3B:
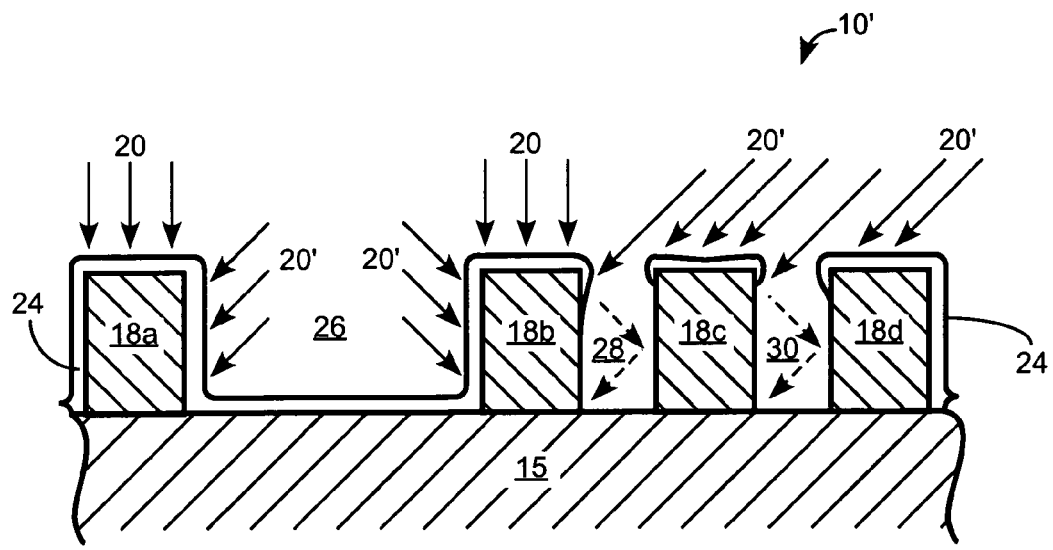
FIG. 3B illustrates the top of semiconductor wafer during the photoresist trimming process, in accordance with one embodiment of the present invention.

FIG. 3B illustrates the top of semiconductor wafer 10' during the process of photoresist trimming, in accordance with one embodiment of the present invention. After or during the process of forming polymer film 24, a plasma etch is performed to reduce the critical dimensions of photoresist lines 18a–d. Photoresist lines 18a–d are exposed to an etchant flow 20/20', using a low RF bias power. Etchant flow 20/20' is created by introducing oxygen or nitrogen gas into a plasma environment.

After contacting an electron from the excited plasma, the oxygen or nitrogen molecules break into positive electron ion pairs. The positive ions bombard photoresist lines 18a–d and etch the photoresist lines 18a–d due to a negative charge on semiconductor wafer 10'. Etchant flow 20' is distinguished from etchant flow 20 by its angle of incidence with respect to semiconductor wafer 10'. That is, where etchant flow 20 is substantially normal relative to plane P, etchant flow 20' is angled with respect to plane P. Because oxygen and nitrogen ions etch at a very fast rate, it is often useful to add gas additives to limit the rate of etch. Additives such as chlorine or hydrogen bromide control the etch rate by limiting the number of oxygen or nitrogen radicals (positive ions) created within the processing chamber.

The degree of exposure each photoresist line 18a–d has to the ion bombardment varies depending on its proximity to that of other photoresist lines in the same manner as the exposure photoresist lines 18a–d had to the deposition precursor flow 22. If the sidewall of a photoresist line is located in a low aspect ratio area, and it is fully exposed to etchant flow 20'. However, if the sidewall of a photoresist line is located in a high aspect ratio area, the amount of etchant flow 20' that reaches the lower portions of photoresist sidewalls may be greatly reduced because a large amount of etchant flow 20' is blocked by a neighboring photoresist line.

For example, photoresist line 18a is isolated from other photoresist lines 18b–d. Therefore, photoresist lines 18b–d do not affect the exposure of photoresist line 18a to etchant flow 20'. However, because photoresist line 18c is located in close proximity to photoresist lines 18b and 18d, photoresist lines 18b and 18d block much of etchant flow 20'. For an ion to reach the bottom of the a sidewall of photoresist line 18c, the ions needs to either travel towards the sidewall at the perfect angle, or bounce from sidewall to sidewall as shown in FIG. 3B. The amount of etchant flow 20' that reaches the sidewalls of photoresist lines 18b and 18d are likewise reduced by the close proximity of photoresist line 18c.

Polymer film 24 protects photoresist lines 18a–d from plasma etching. Before photoresist lines 18a–d are exposed to etchant flow 20/20', polymer film 24 is etched away by etchant flow 20/20'. However, because polymer film 24 is thinner at the bottom regions of high aspect ratio areas 28 and 30, the polymer film 24 provides less protection for such areas of polymer film 24 during photoresist trimming than for other areas of polymer film 24. For example, because polymer film 24 is much thicker in low aspect ratio area 26 than at the bottom regions of high aspect ratio areas 28 and 30, the polymer film 24 will require a greater amount of ion bombardment to etch.

As shown in FIG. 3B, etchant flow 20' has etched away the thinnest portion of polymer film 24 at the bottom region of high aspect ratio areas 28 and 30, exposing portions of photoresist lines 18b–d. Therefore, the etching of the exposed portions of photoresist lines 18b–d begins before the etching of regions still protected by polymer film 24. However, because so much of etchant flow 20' is blocked from reaching the bottom regions of high aspect ratio areas 28 and 30, the etching of the bottom regions is also much slower than the etching of other regions.

The variable thickness of polymer film 24 provides a beneficial effect on photoresist lines 18a–d during photoresist trimming. As described above, polymer film 24 is thicker in sidewall regions that have full exposure to etchant flow 20', and thinner in sidewall regions that have reduced exposure to etchant flow 20'. That is, the thickness of polymer film 24 is directly proportional to the polymer film 24 exposure to the etchant flow 20'. By depositing polymer film 24 on top of photoresist lines 18a–d, an operator is able to control the etch rate variation between the two regions by adjusting the rate of deposition precursor flow 22/22'. It is preferred that the etching occurs at a slightly faster rate than deposition, therefore the etch to deposition ratio is preferably less than 1:1.

Although, the deposition of a polymer film and the process of photoresist trimming have been illustrated separately in FIGS. 3A and 3B, in a preferred embodiment of the present invention, they occur concurrently. This is accomplished by adding polymer inducing gas additives during etching. The excited plasma environment that splits oxygen or nitrogen molecules into etchant ions also splits fluorocarbon and hydrocarbon gases, and forms a deposition precursor. Etch rate variation between different regions of the semiconductor wafer may also be controlled by choosing a specific fluorocarbon or hydrocarbon additive that produces a stickier or less sticky deposition precursor.

Figure 2C:
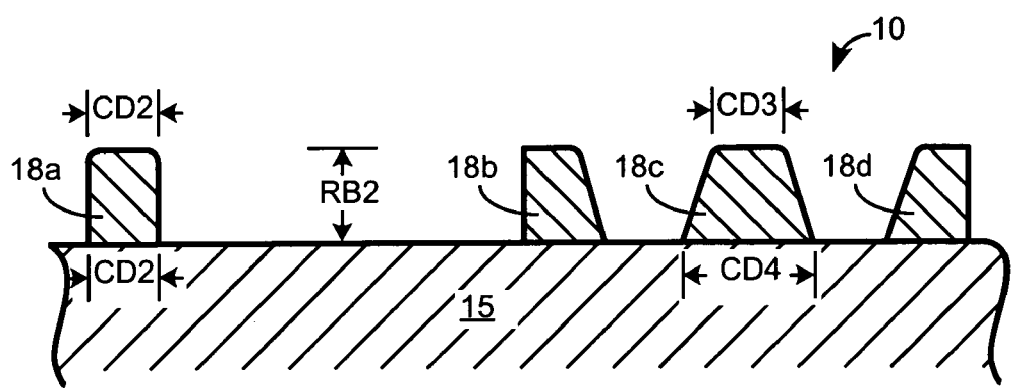
FIG. 2C illustrates a prior art process of photoresist trimming that has been completed.
Figure 2D:
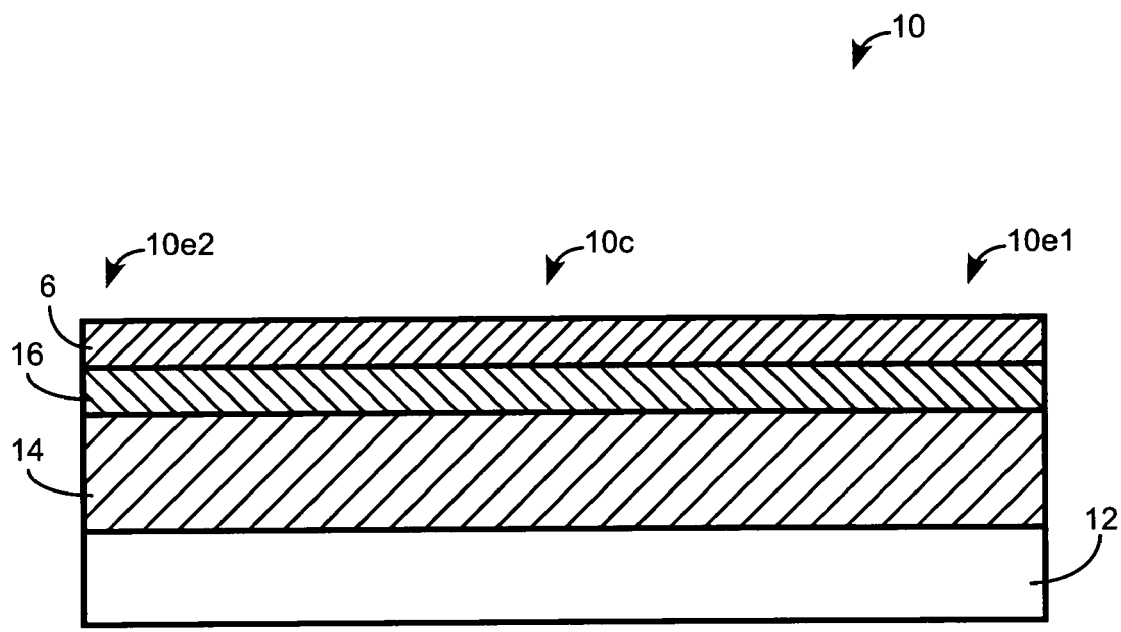
FIG. 2D illustrates a cross section view of the semiconductor wafer, in accordance with the prior art.
Figure 2E:
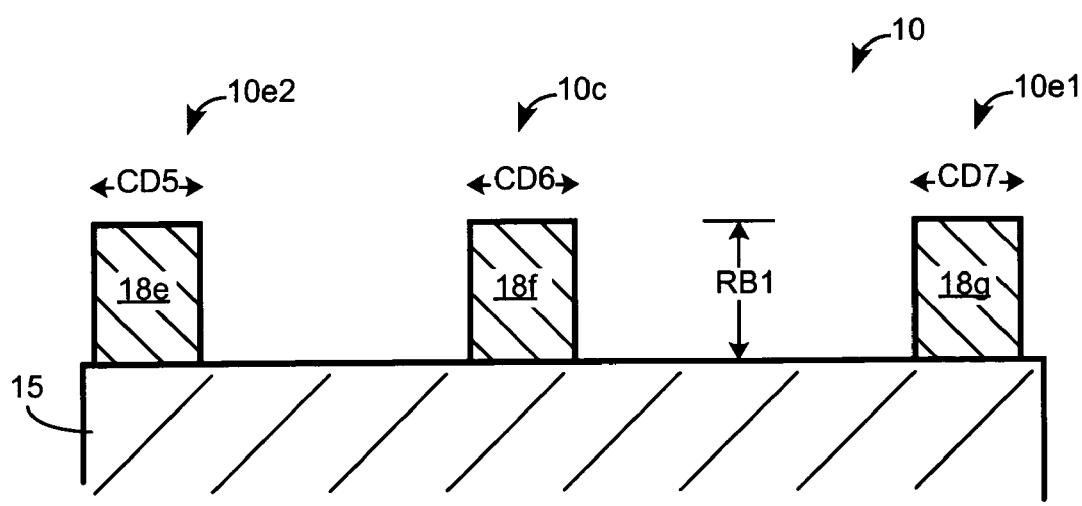
FIG. 2E illustrates a patterned photoresist layer to be processed using the prior photoresist trimming.
Figure 2F:
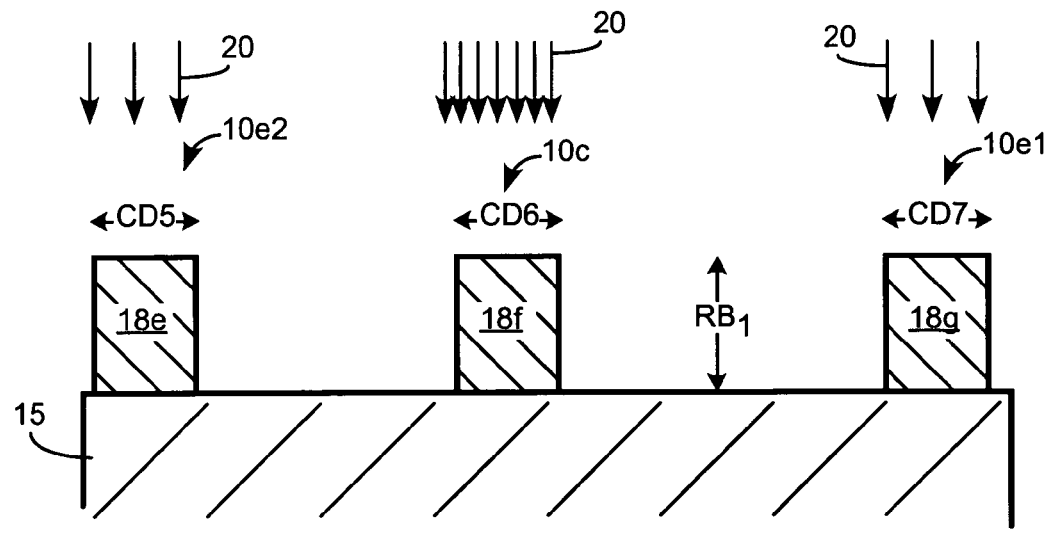
FIG. 2F illustrates a prior art process of photoresist trimming.
Figure 2G:
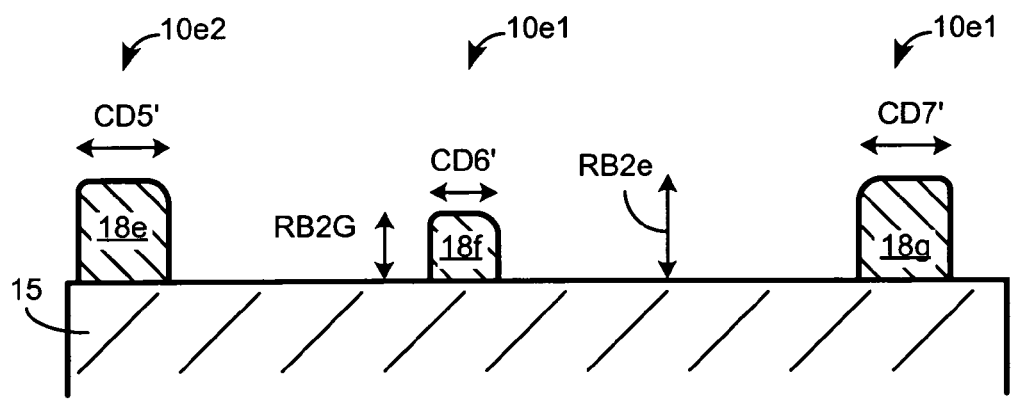
FIG. 2G illustrates a prior art process of photoresist trimming that has been completed.
Figure 2H:
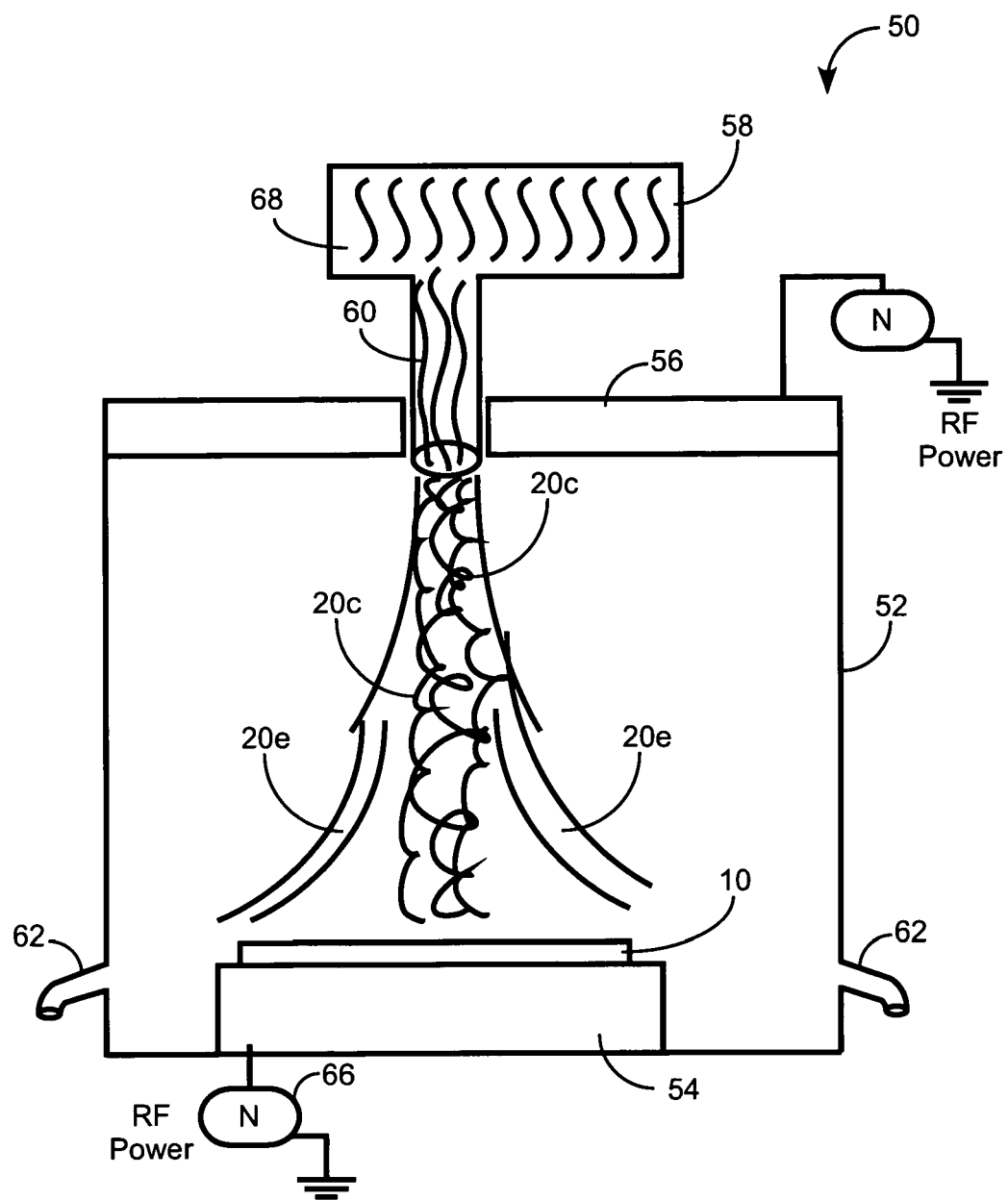
FIG. 2H illustrates a prior art process of photoresist trimming being performed in a plasma etch chamber.
Figure 3C:
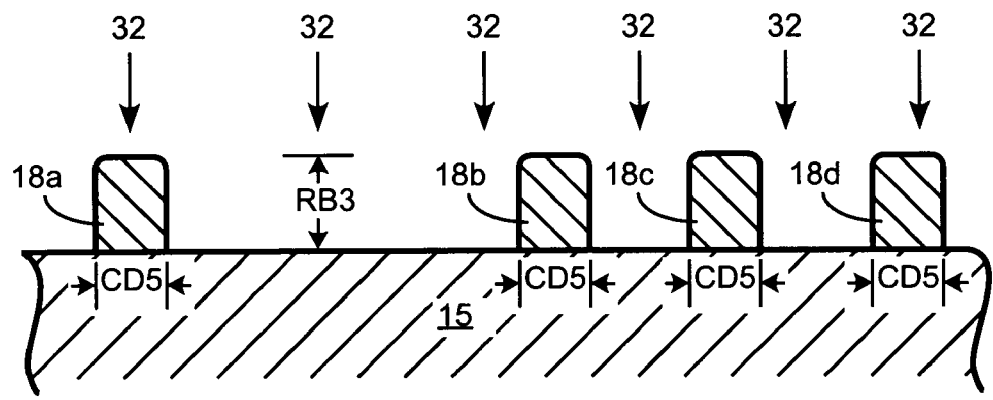
FIG. 3C illustrates the photoresist mask after the process of photoresist trimming has been completed, in accordance with yet another embodiment of the present invention.

FIG. 3C illustrates the photoresist mask after the process of photoresist trimming has been completed, in accordance with one embodiment of the present invention. In contrast to the tapered photoresist lines formed by a prior art process (as illustrated in FIG. 2C with critical dimensions CD3 and CD4), photoresist lines 18b–d have an essentially consistent line width from top to bottom. By using the process of the present invention as described above, the critical dimensions CDs of photoresist lines 18a–d may be trimmed to geometries below 0.18 microns while reducing the errors that result from the fabrication of a semiconductor device from a wafer with tapered photoresist lines. In turn, the fabricated device will allow manufacturers to meet the increasing demands for speed in the industry.

In addition to making photoresist lines with less taper, the present invention may also be used to preserve the resist budget of the photoresist lines. The resist budget is a measurement of the vertical height of the photoresist line, and also a measurement of the level of protection that each photoresist line provides from etching. During the etching of intermediate layers 15 with an intermediate layers etch ant 32, photoresist lines 18a–d are also etched, reducing the height of each line. If the resist budget is too low, intermediate layers etchant 32 may undesirably etch intermediate layers 15.

Because the tops of photoresist lines 18a–d are fully exposed to deposition precursor flow 22/22', polymer film 24 is formed at full thickness. Therefore, when photoresist trimming is performed, polymer film 24 not only helps photoresist lines resist tapering, but it also aids in the preservation of resist budget RB of each photoresist line 18a–d by slowing the vertical etch rate from etchant flow 20/20', and maximizing the post trim resist thickness. Resist budget RB is therefore greater than RB2 (shown in FIG. 2C), and better able to ensure that there is enough photoresist material to prevent damage to the layers below.

Figure 4:
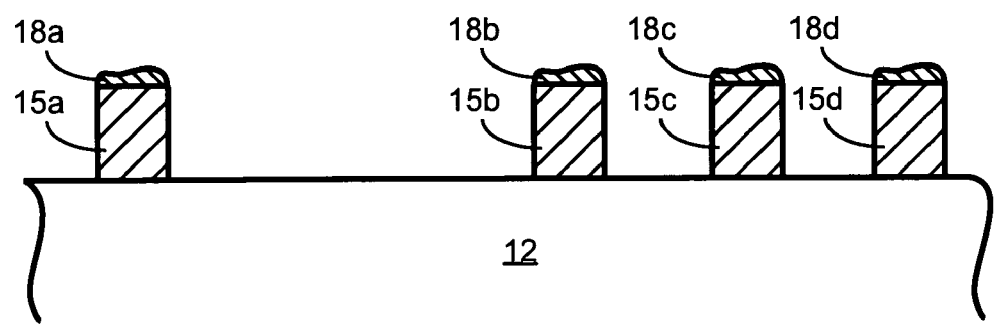
FIG. 4 illustrates semiconductor wafer after the etching of intermediate layers, in accordance with still another embodiment of the present invention.

FIG. 4 illustrates semiconductor wafer 10' after the etching of intermediate layers 15, in accordance with one embodiment of the present invention. In this exemplary Figure, intermediate etchant 32 has etched away large portions of intermediate layers 15, leaving intermediate layers lines 15a–d. As shown, the pattern of trimmed photoresist lines 18a–d has been transferred, forming intermediate layers lines 15a–d, each of which has a line width of less than 0.18 microns. On top of each intermediate layers line 15a–d lies the remnants of photoresist lines 18a–d. As discussed above, the increased budget RB of photoresist lines 18a–d aids in ensuring that the portions of intermediate layers 15 below are protected from etching. Photoresist line remnants 18a–d are then removed from semiconductor wafer 10' typically by the use of a stripping solvent.

Figure 5:
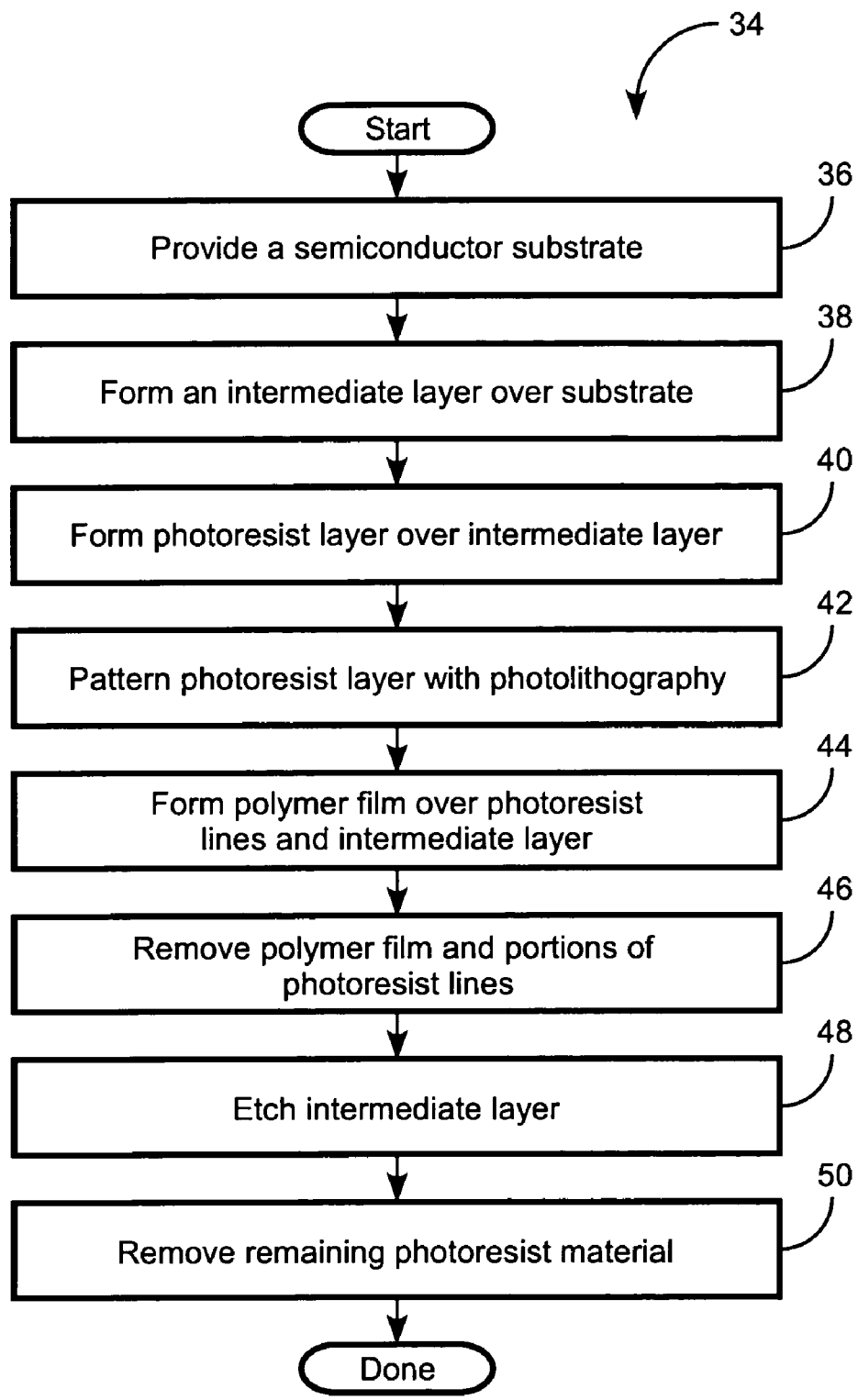
FIG. 5 is a flow chart of a method operations for reducing profile variation and preserving resist budget in photoresist trimming, in accordance with still another embodiment of the present invention.

FIG. 5 is a flow chart of a method 34 for reducing profile variation and preserving resist budget in photoresist trimming, in accordance with one embodiment of the present invention. Method 34 begins with operation 36, which provides a semiconductor substrate for processing. An intermediate layers is then formed over the semiconductor substrate in operation 38. The intermediate layers includes a first layer, which is formed of a conductive material or a dielectric material depending on the type of semiconductor device being fabricated. The intermediate layers may also include a second layer comprising a hard mask layer, an ARC layer, or both.

A layer comprised of photoresist material is then formed over the intermediate layers in operation 40, and patterned using photolithography to form a set of photoresist lines in operation 42. If the desired feature geometries of the semiconductor wafer are below 0.18 microns in size, photolithography will be unable to transfer such a pattern to the photoresist layer. However, in such situations, photolithography is used to transfer the smallest pattern possible, which is about 0.18 microns in size. After photolithography is performed, then the process of photoresist trimming patterns each photoresist line to the correct size.

Method 34 then moves to operation 44, which forms a polymer film over the photoresist lines and the intermediate layers. The polymer film and portions of the photoresist lines are then removed by an etching process that trims the photoresist lines to their desired dimensions. The polymer film is formed preferably by depositing a deposition precursor on the surfaces of the photoresist lines and the intermediate layers. The deposition precursor may be formed at the same time as the etching process by including a polymer inducing gas additive such as $CH_xF_y$ or CHx as described above.

Operation 46 then removes the polymer film and portions of the photoresist lines by using plasma etching. Because of the presence of the polymer film, the thickness of which may be controlled by varying the stickiness of the deposition precursor of the polymer film, the remaining photoresist lines resist tapering and maximize resist budget. The intermediate layers is etched in operation 48, to form the proper interconnections within a functioning semiconductor device, after which the remaining photoresist material is removed in operation 50.

Figure 6A:
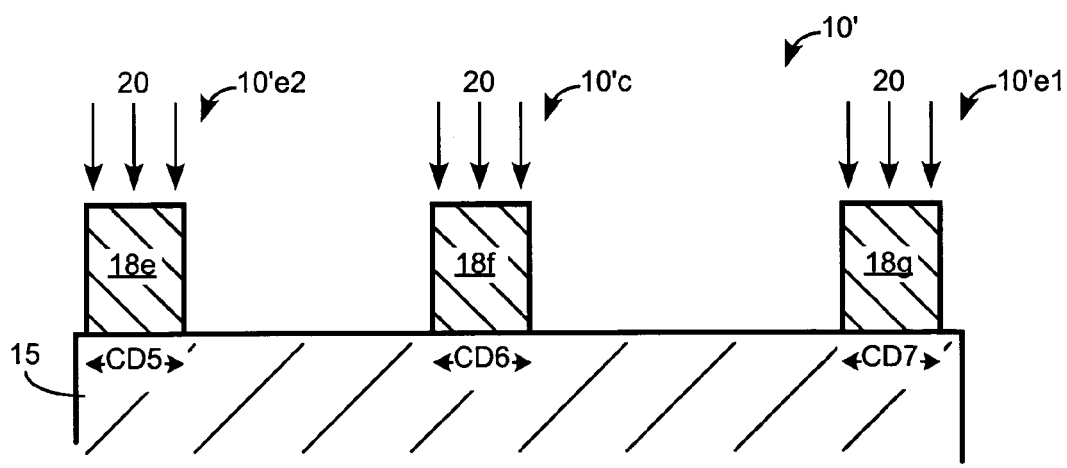
FIG. 6A is a simplified cross section view illustrating photoresist trimming of photoresist lines respectively defined in edge regions and center region of the semiconductor wafer, in accordance with yet another embodiment of the present invention.

The capability of the embodiments of the present invention to produce photoresist lines having consistent and uniform critical dimensions throughout different regions of the semiconductor wafer 10' is shown with reference to FIGS. 6A–8C, in accordance with one embodiment of the present invention. FIG. 6A illustrates photoresist trimming of photoresist lines 18e and 18g defined in edge regions 10'e2 and 10'e1 and photoresist line 18f defined in the center region 10'c, in accordance with one embodiment of the present invention. As shown in FIG. 6B, the photoresist lines 18e–18g, initially having the corresponding critical dimensions CD5, CD6, and CD7 have been trimmed to respectively have critical dimension CD5', CD6', and CD7'.

Figure 6B:
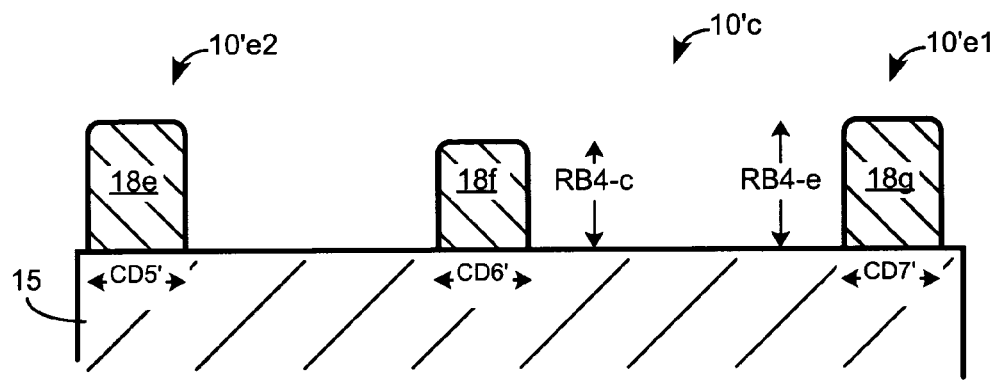
FIG. 6B is a simplified cross section view illustrating photoresist trimmed photoresist lines defined in edge regions and center region of the semiconductor wafer at the conclusion of the photoresist trimming process, in accordance with yet another embodiment of the present invention
Figure 6C:
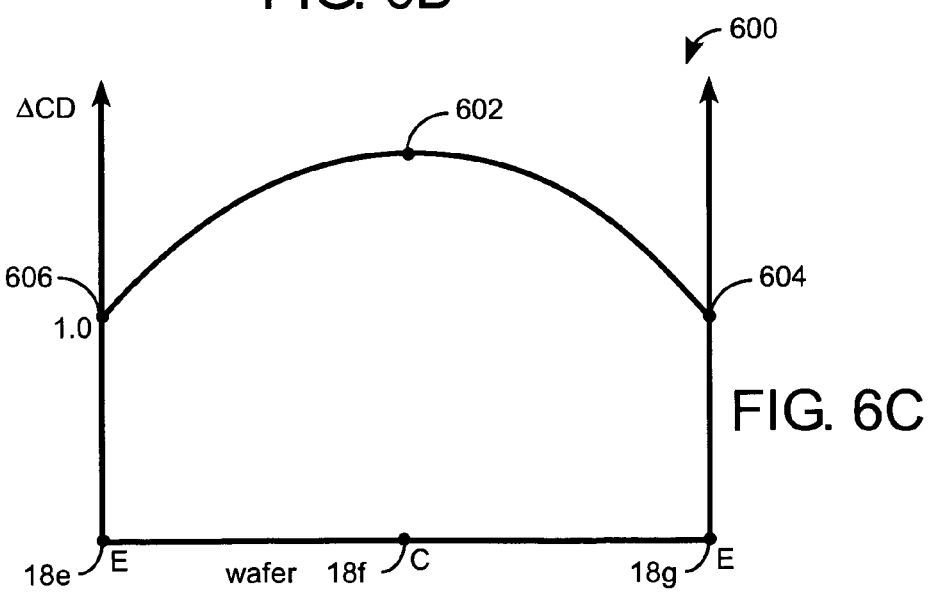
FIG. 6C is a plot of differences in the critical dimensions of photoresist lines in the edge and center regions of the semiconductor wafer, in accordance with still another embodiment of the present invention.

The differences in the critical dimensions CD5', CD6', and CD7' of the photoresist lines 18e–18g and the initial critical dimensions CD5, CD6, and CD7 of the photoresist lines 18e–18g are shown in a plot 200 of FIG. 6C, in accordance with one embodiment of the present invention. As shown, the differences in the critical dimensions vary depending on the region each of the photoresist lines 18e–18g is defined. A point 602 defines the difference in critical dimension of the photoresist line 18f before and after the photoresist trimming. As shown, the photoresist line 18f is defined in the center region 10'c as opposed to the photoresist lines 18e and 18g that are defined in the edge regions 10'e2 and 10'e1. In a like manner, the points 606 and 604 represent differences in critical dimensions of the photoresist lines 18e and 18g, before and after the photoresist trimming. As shown, photoresist lines 18e and 18g are respectively defined in the edge regions 10'e2 and 10'e1. As expected, the differences in the critical dimension of the photoresist line 18f defined in the center region 10c of the semiconductor wafer 10' is significantly higher than the difference in critical dimensions of the photoresist lines 18e and 18g defined in the edge regions 10e2 and 10e1.

In one example, an etch recipe shown in Table 1 below can be implemented to perform the process of photoresist trimming of the photoresist lines 18e–18g, shown in the embodiment of FIGS. 6A–6C. Thus, in the embodiments of the present invention the thickness of the conformal layer is set to vary depending on the rate of removal of the conformal layer of polymer in each region. In some embodiments, the thickness of the conformal layer is set to vary by selecting different recipes. In the embodiments illustrated in FIGS. 6A–6C, a conformal polymer film has not been formed on the photoresist lines 18e–g.

TABLE 1

| | Photoresist Trimming center more than edges | | | | | | |
|---|---|---|---|---|---|---|---|
| | Source Power TCP (W) | Bias Voltage (Vb) | Temp. (C.) | $O_2$ flow (sccm) | HBr (sccm) | $CH_xF_y$ (sccm) | Pressure (mT) |
| Target | 500 | −30 | 60 | 18 | 58 | 0 | 5 |
| Medium Range | 300–700 | 0–100 | 60 | 10–50 | 50–100 | 0 | 4–30 |
| Wide Range | 150–1000 | 0–200 | 40–80 | 10–100 | 20–100 | 0 | 4–50 |

Figure 7A:
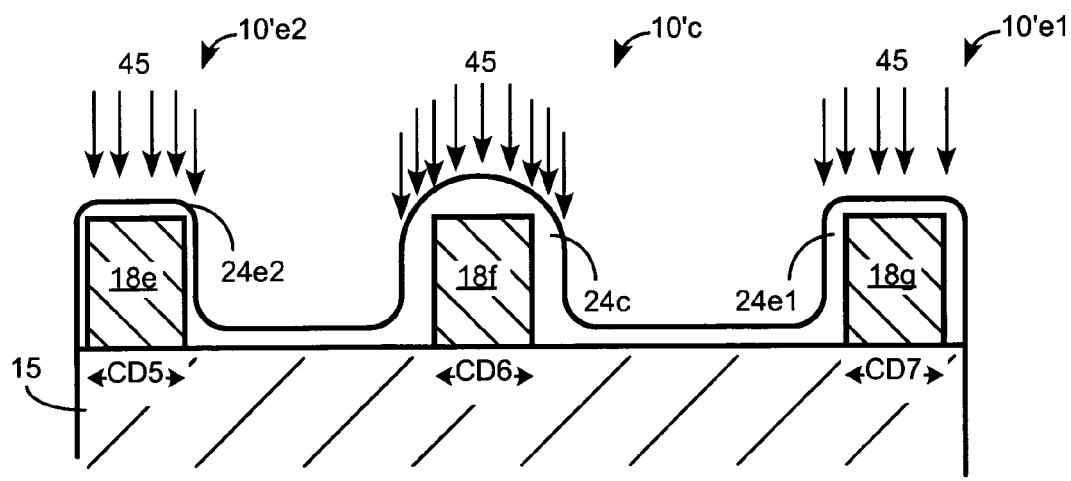
FIG. 7A is a simplified cross sectional view of a plurality of photoresist lines having a conformal polymer film deposited thereon implementing a small amount of polymer inducing gas additive during the etch operation, in accordance with still another embodiment of the present invention.
Figure 7B:
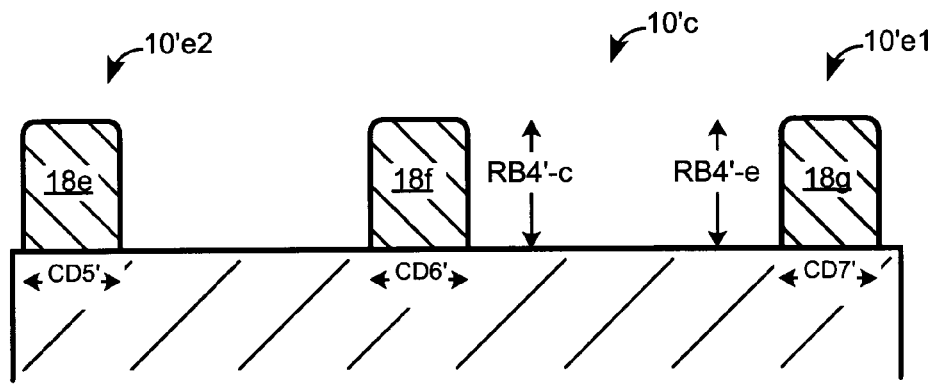
FIG. 7B is a simplified cross sectional view of the plurality of photoresist lines having the conformal polymer film deposited thereon of FIG. 7A at the conclusion of the deposition/etching operation amount of polymer inducing gas additive during the etch operation, in accordance with yet another embodiment of the present invention.
Figure 7C:
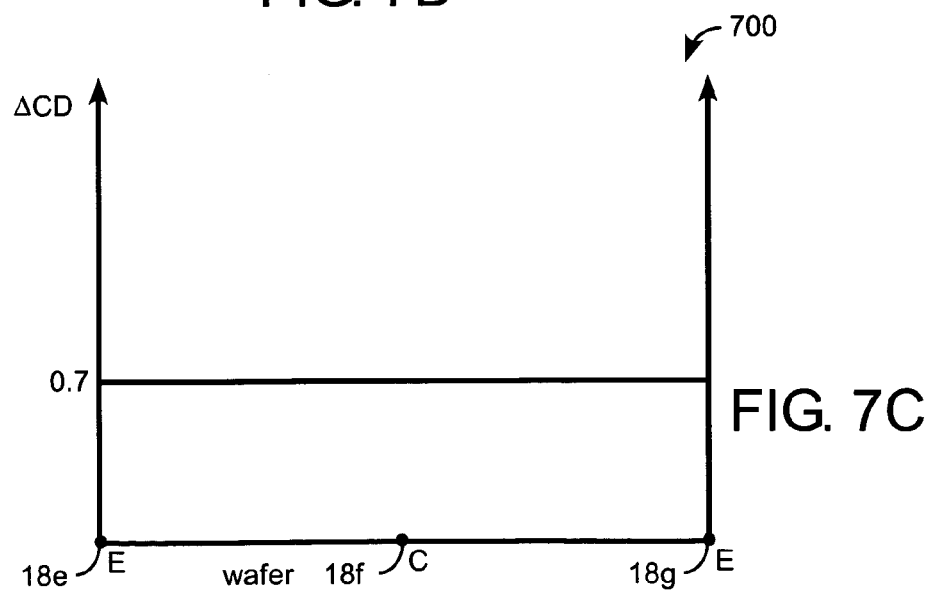
FIG. 7C is a plot showing minimal differences in the critical dimensions of photoresist lines in the edge and center regions of the semiconductor wafer, in accordance with still another embodiment of the present invention.

Reference is made to FIGS. 7A–7C wherein depositing a conformal polymer film on the surfaces of the photoresist lines using a small amount of polymer inducing gas additive during the etch operation is illustrated, in accordance with one embodiment of the present invention. As shown in FIG. 7A, forming of the conformal polymer film 24 occurs while the conformal film 24 is being concurrently etched using a deposition/etch flow 45.

In one embodiment, the deposition/etch flow 45 can be created by introducing a suitable amount of polymer inducing gas additive and process gas to the plasma environment. In one example, the polymer inducing gas additive causes the process gas to be decomposed producing polymers. In one embodiment, polymers are similar to photoresists, in composition, and are configured to provide protection for photoresist lines 18e–g from the plasma etching being performed concurrently during the process of photoresist trimming.

In accordance with one embodiment, as discussed above, the polymer inducing gas additives can be Hydroflourocarbon plasmas (e.g., $CH_xF_y$ such as $CH_2F_2$ or CHF), flourocarbons (e.g., $CF_x$ such as $CF_4$), and hydrocarbon plasmas, (e.g. $CH_x$ including hydrocarbons such as $CH_4$ or $C_2H_6$). The polymer inducing gas additive can be implemented to produce polymers having low ion bombardment resulting in the deposition of the conformal polymer film 24. In one exemplary embodiment, by splitting to $CF_3$ and F, a fluorocarbon such as $CF_4$ is excited while encountering an electron from an excited plasma environment. The $CF_3$ is then deposited on top of semiconductor wafer 10' to start forming and building up the conformal polymer film 24.

In the embodiment of FIG. 7A, the small amount of the polymer inducing gas additive is used to create a center precursor deposition 24c over the photoresist line 18f. As shown, while forming the polymer film 24, the plasma etch is performed to reduce the critical dimensions CD5–CD7 of the respective photoresist lines 18e–g. In one embodiment, the illustrated photoresist lines 18e–g are exposed to the deposition/etchant flow 45, using a low RF bias power. By way of example, the deposition/etchant flow 45 is created by introducing oxygen or nitrogen gas as well as $CH_4$ into a plasma environment.

In accordance to one embodiment, as discussed above, the etch operation is achieved by the oxygen or nitrogen molecules contacting an electron from the excited plasma and breaking into positive electron ion pairs. Due to a negative charge on semiconductor wafer 10', the positive ions bombard photoresist lines 18e–g and etch the polymer film 24 and the photoresist lines 18a–g. In one instance, as oxygen and nitrogen ions etch at a very fast rate, the gas additives are used to limit the etch rate. By way of example, additives such as chlorine or hydrogen bromide control the etch rate by limiting the number of oxygen or nitrogen radicals (positive ions) created within the processing chamber.

In accordance with one embodiment, the function of the polymer film 24 is to protect photoresist lines 18e–g from being etched. Thus, the polymer film 24 is beneficially etched away by the deposition/etchant flow 45 prior to the photoresist lines 18e–g being etched using the etchant/etchant flow 45. Thus, as the concentration of the plasma is greater over the center of the semiconductor wafer, the illustrated center precursor deposition 24c is thicker than the edge precursor depositions 24e2 and 24e2, respectively. In this manner, as shown in the embodiment of FIG. 6B, it is believed that the thicker precursor deposition 24c compensates for the greater concentration of etch/deposition flow 45 over the center region 10'c of the semiconductor wafer 10', thus creating uniform and consistent critical dimensions throughout the semiconductor wafer 10'. As illustrated in FIG. 7B, at the conclusion of the photoresist trimming process, the photoresist lines 18e–18g have been trimmed to respectively have critical dimensions CD5', CD6', and CD7'. Although, as desired, the critical dimensions CD5', CD6', and CD7' are less than the respective initial critical dimensions CD5, CD6, and CD7, it is believed that there are no substantial differences between the critical dimensions CD5' and CD7' of the photoresist lines 18e and 18g defined in the edge regions 10'e2 and 10'e1, as opposed to the critical dimension CD6' of the photoresist line 18f defined in the center region 10'c.

As shown in FIG. 7A, the deposition/etch process has different effects on photoresist lines depending on the locations of each of the photoresist lines 18e–g. That is, it is believed that having additional deposition of center precursor deposition 24c ultimately results in a substantially uniform and consistent critical dimension on the photoresist lines, despite the photoresist line being defined in the center region.

Although in these embodiments polymer deposition and etching is performed concurrently using deposition/etch flow 45, in another embodiment, polymer film 24 may be formed prior to performing the plasma etch operation configured to trim the photoresist lines 18e–g. Furthermore, due to polymer film 24 having a similar composition to that of photoresist material, the polymer film 24 may be ashed and removed by the same process recipe that ashes photoresist material.

Controlling edge-to-center profile variation of photoresist lines so as to achieve uniform and consistent critical dimensions subsequent to photoresist trimming of the present invention is shown using a plot 700 of FIG. 7C, in accordance with one embodiment of the present invention. As shown, no significant distinctions can be detected between the differences in the critical dimensions of photoresist lines 18e and 18g and the critical dimension of the photoresist line 18f. That is, it is believed that by implementing a small amount of polymer inducing gas additive so as to arrive at thicker precursor deposition on the center region 10'c. Thus, the embodiments of the present invention beneficially compensate for the greater concentration of etch/deposition flow 45 over the center region 10'c of the semiconductor wafer 10', leaving uniform and consistent critical dimensions throughout the semiconductor wafer 10'.

In one embodiment, an etch recipe provided in Table 2 can be implemented to arrive at consistent and uniform critical dimensions of photoresist lines throughout the semiconductor wafer.

TABLE 2

| | Center-to-Edge uniform Photoresist Trimming | | | | | | |
|---|---|---|---|---|---|---|---|
| | Source Power, TCP (W) | Bias Voltage (Vb) | Temp. (C.) | $O_2$ flow (sccm) | HBr (sccm) | $CH_xF_y$ (sccm) | Pressure (mT) |
| Target | 700 | 0 | 60 | 18 | 58 | 15 | 15 |
| Medium Range | 300–700 | 0–50 | 60 | 10–50 | 50–100 | 10–50 | 4–30 |
| Wide Range | 150–1000 | 0–200 | 40–80 | 10–100 | 20–100 | 10–60 | 4–50 |

In another embodiment, the photoresist trimming of the present invention can implement a greater amount of polymer inducing gas additive can be implemented to perform the photoresist trimming process so as to overcompensate for reducing the critical dimension of the photoresist line 18f, defined in the center region 10'c, in accordance with one embodiment of the present invention. As shown in FIG. 7A, the conformal polymer layer 24 is formed over the photoresist lines 18e–18g using the deposition/etchant flow 45, while the deposition film 24 is being concurrently etched. In the embodiment illustrated in FIG. 7A, the greater amount of the polymer inducing gas additive is used to create the center precursor deposition 24c' over the photoresist line 18f and the edge precursor depositions 24e2 and 24e. As shown, to overcompensate for the greater concentration of plasma over the photoresist line 18f, the precursor deposition 24c' is significantly more than the precursor deposition 24c of FIG. 7A. In this manner, while forming the polymer film 24, the plasma etch operation is performed to reduce the critical dimensions of photoresist lines 18e–g.

Figure 8A:
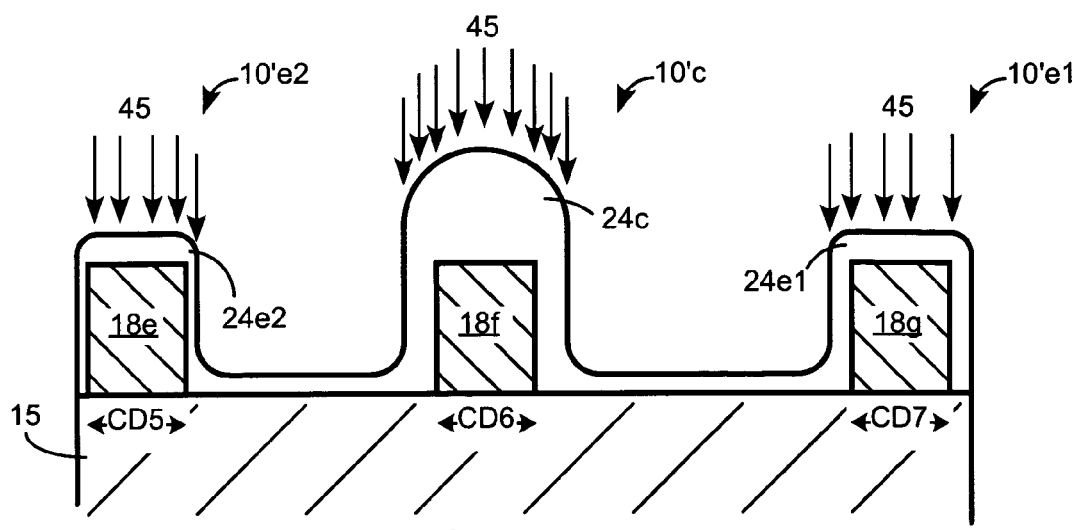
FIG. 8A is a simplified cross sectional view of a plurality of photoresist lines having a conformal polymer film deposited thereon implementing a greater amount of polymer inducing gas additive during the etch operation, in accordance with still another embodiment of the present invention
Figure 8B:
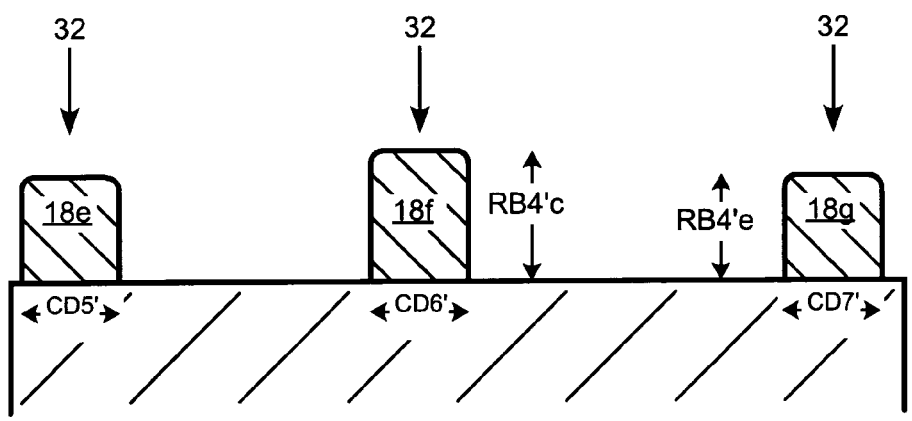
FIG. 8B is a simplified cross sectional view of the plurality of photoresist lines having the conformal polymer film deposited thereon of FIG. 8A at the conclusion of the deposition/etching operation, in accordance with still another embodiment of the present invention.
Figure 8C:
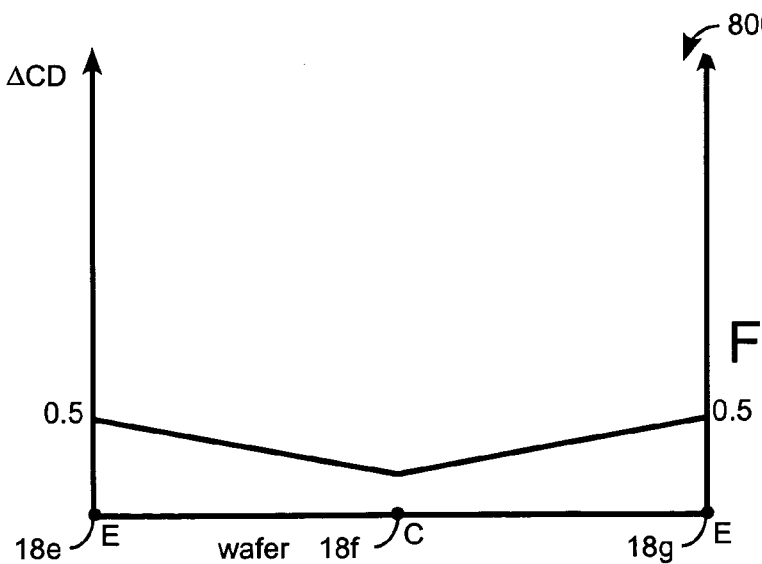
FIG. 8C is a plot showing differences in the critical dimensions of photoresist lines in the edge and center regions of the semiconductor wafer, in accordance with still another embodiment of the present invention.

As illustrated, during the photoresist trimming process, a greater amount of deposition precursor 24c is deposited on the photoresist line 18f as opposed to the deposition precursors 24e2 and 24e1 deposited on the photoresist lines 18e and 18g. Thus, as the deposition precursors 24e2 and 24e1 and the 24c are etched, the deposition precursors 24e2 and 24e1 are consumed completely prior to the deposition precursor 24c. Consequently, portions of the photoresist lines 18e and 18g are etched. As shown in FIG. 8B, at the conclusion of the photoresist trimming process, the critical dimension CD5', CD6', and CD7' of the photoresist lines 18e–g are shown to be less than the initial critical dimensions CD5, CD6, and CD7. However, in a plot 800 shown in FIG. 8C, the differences between the initial critical dimensions CD5', CD7', and the initial critical dimensions CD5 and CD7 are greater for the photoresist lines 18e and 18g defined in the edge region 10e2 and 10e1 than the critical dimension CD6' of photoresist line 18f defined in the center region 10c.

Thus, the reduction of the critical dimension of photoresist lines defined in the center region of the semiconductor substrate can be over compensated. As shown, in contrast to the plot shown in FIG. 7C, the differences in the critical dimensions of the photoresist lines 18e and 18g defined in the edge regions 10'e2 and 10'e1 is significantly higher than the differences in the critical dimension of the photoresist line 18f defined in the center region 10'c. Thus, in this manner, the embodiments of the present invention can be implemented to control and tune the differences in the critical dimensions of photoresist lines.

In one embodiment, the recipe shown in Table 3 can be implemented to control, tune, or overcompensate the differences in the critical dimensions.

TABLE 3

Photoresist Trimming the edge more than the center

|  | Source Power, TCP (W) | Bias Voltage (Vb) | Temp. (C.) | $O_2$ flow (sccm) | HBr (sccm) | $CH_xF_y$ (sccm) | Pressure (mT) |
|---|---|---|---|---|---|---|---|
| Target | 700 | −30 | 60 | 18 | 58 | 45 | 15 |
| Medium Range | 300–700 | 0–50 | 60 | 10–50 | 50–100 | 10–80 | 4–30 |
| Wide Range | 150–1000 | 0–200 | 40–80 | 10–100 | 20–100 | 10–150 | 4–50 |

In one embodiment, as the tops of photoresist lines 18e–g are fully exposed to deposition/etch flow 45, polymer film 24 is formed over the photoresist layer at full thickness. In this manner, polymer film 24 formed over the photoresist lines 18e–g aids in preserving the resist budget RB4'c and RB4"c of the photoresist line 18f (defined in the center region 10'c) and resist budge RB4'e, and RB4"e of the photoresist lines 18e and 18g (defined in the edge regions 10'e2 and 10'e1) by slowing the vertical etch rate. As a result, resist budget RB4'c is greater than the resist budget RB4'c while the resist budge RB4'e is greater than resist budget RB4"e. The embodiments of the present invention are capable of ensuring the presence of enough photoresist material to prevent any damages to the layers below.

Thus, according to the photoresist trimming process of the present invention, after etching the exposed portions of the intermediate layers 15, intermediate layers lines 15e–g will remain. Preferably, the pattern of trimmed photoresist lines 18e–g has been transferred, forming intermediate layers lines 15e–g, each of which has a line width of less than 0.18 microns. In one example, the remnants of photoresist lines 18e–g remain on the formed intermediate layers lines 15e–g. In this manner, as discussed above, the increased budget RB4"c and RB4'C of photoresist lines 18e–g aid in confirming that the portions of intermediate layers 15 below the photoresist lines 18e–g are protected from etching. In one example, remnants of the photoresist lines 18e–g are then removed from semiconductor wafer 10' using a stripping solvent.

The embodiments of the present invention are capable of providing a polymer film 24 having a variable thickness, which in one example, the thickness of polymer film 24 is directly proportional to the polymer film exposure to the deposition/etchant flow 45. In this manner, the etch rate variation between different regions of the semiconductor wafer can be controlled or tuned through adjusting the rate of deposition/etch flow 45. In the preferred embodiments, the etching occurs at a slightly faster rate than deposition, therefore the etch to deposition ratio is preferably less than 1:1.

It will therefore be appreciated that the present invention provides a method of forming very small photoresist lines having a consistent critical dimension from top to bottom, and an adequate resist budget. The photoresist lines are capable of patterning a wafer with feature geometries below 0.18 microns into a semiconductor wafer. The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for controlling a removal of photoresist material from a semiconductor substrate, the method comprising:
   providing the semiconductor substrate, the semiconductor substrate having a photoresist mask formed thereon; and
   forming a conformal layer of polymer over the photoresist mask and a portion of the semiconductor substrate not covered by the photoresist mask while concurrently etching a portion of the conformal layer of polymer, a thickness of the conformal layer of polymer on a center region of the semiconductor substrate and edge regions of the semiconductor substrate being set to vary depending on a removal rate of the conformal layer of polymer in the center region of the semiconductor substrate and the edge regions of the semiconductor substrate, wherein etching the conformal layer of polymer is performed prior to etching a material defined under the photoresist mask.

2. A method as recited in claim 1, the method further comprising:

determining the removal rate of the conformal polymer layer in the center region of the semiconductor substrate and the edge regions of the semiconductor substrate; and increasing the thickness of the portion of the conformal layer of polymer to be formed in one of the center region of the semiconductor substrate and the edge regions of the semiconductor substrate having a greater removal rate.

3. A method as recited in claim 2, wherein an increased thickness of the portion of the conformal layer of polymer having the greater removal rate is configured to be removed so as to prevent the removal of the photoresist mask.

4. A method as recited in claim 1, wherein the thickness of the conformal layer of polymer is changed using a polymer inducing gas additive.

5. A method as recited in claim 1, wherein the conformal layer of polymer defined in the center of the semiconductor substrate is set to be trimmed more than the conformal layer of polymer defined in the edge regions of the semiconductor substrate.

6. A method as recited in claim 1, wherein the conformal layer of polymer defined in the center of the semiconductor substrate and the edge regions of the semiconductor substrate is set to be trimmed such that the conformal layer of polymer in the center of the semiconductor substrate and the edge regions of the semiconductor substrate are substantially uniform.

7. A method as recited in claim 1, wherein the conformal layer of polymer defined in the center of the semiconductor substrate is set to be trimmed less than the conformal layer of polymer defined in the edge regions of the semiconductor substrate.

8. A method as recited in claim 1, wherein the removal rate of the conformal layer of polymer is higher than a deposition rate of the conformal layer of polymer.

9. A method as recited in claim 1, wherein the conformal layer of polymer is formed and etched in a plasma etching operation.

10. A method as recited in claim 9, wherein the conformal layer of polymer is formed using a polymer inducing gas additive.

11. A method for reducing a removal of photoresist material from a semiconductor wafer, the method comprising:

providing a semiconductor substrate having an intermediate layer;

forming a layer of photoresist mask over the intermediate layer using the photoresist material; and forming a conformal layer of polymer over the photoresist mask while concurrently etching the conformal layer of polymer using a plasma, the conformal layer of polymer being set to be formed so as to have a greater thickness in a center region of the semiconductor wafer than edge regions of the semiconductor wafer, a thicker portion of the conformal layer of polymer formed in the center region being removed instead of the photoresist material, wherein etching the conformal layer of polymer over the photoresist mask is performed prior to etching the intermediate layer.

12. A method as recited in claim 11, wherein a concentration of the plasma is greater in the center region of the semiconductor wafer.

13. A method as recited in claim 11, wherein the conformal layer of polymer is formed using a polymer inducing gas additive.

14. A method as recited in claim 13, wherein the polymer inducing gas additive is added to the plasma during etching so as to form a polymer precursor.

15. A method as recited in claim 14, wherein the polymer inducing gas additive is a hydrocarbon.

16. A method as recited in claim 13, wherein the thickness of the conformal layer of polymer is substantially greater in the center region than the thickness of the conformal layer in edge regions.

17. A method for tuning photoresist material removal from a semiconductor wafer, the method comprising:

providing a semiconductor substrate having an intermediate layer;

forming a layer of photoresist mask over the intermediate layer;

forming a conformal layer of polymer over the photoresist mask, a thickness of the conformal layer of polymer is set to vary depending on a removal rate of the conformal layer of polymer in a center region of the semiconductor wafer and edge regions of the semiconductor wafer; and etching the conformal layer of polymer, the etching configured to continue until the conformal layer of polymer is removed completely, wherein etching the conformal layer of polymer is configured to trim the photoresist mask prior to etching the intermediate layer.

18. A method as recited in claim 17, wherein continuing the etching operation until the conformal layer of polymer is removed completely results in removing of photoresist material in the center region of the semiconductor wafer or the edge regions of the semiconductor wafer wherein a concentration of a plasma is low.

19. A method as recited in claim 18, wherein a concentration of the plasma is low in the edge regions of the semiconductor wafer.

20. A method as recited in claim 17, wherein the conformal layer of polymer is formed using a polymer inducing gas additive.

21. A method as recited in claim 20, wherein the polymer inducing gas additive is added to the plasma during etching so as to form a polymer precursor.

22. A method as recited in claim 17, wherein the thickness of the conformal polymer layer is greater in the center region of the semiconductor wafer than the edge regions.

* * * * *